United States Patent
Chih et al.

(10) Patent No.: US 9,502,122 B2
(45) Date of Patent: Nov. 22, 2016

(54) SYSTEMS, DEVICES AND METHODS FOR MEMORY OPERATIONS

(71) Applicant: Taiwan Semiconductor Manufacturing Company Limited, Hsinchu (TW)

(72) Inventors: Yue-Der Chih, Hsinchu (TW); Cheng-Hsiung Kuo, Hsinchu County (TW); Gu-Huan Li, Hsinchu County (TW); Chung-Chieh Chen, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 14/620,312

(22) Filed: Feb. 12, 2015

(65) Prior Publication Data

US 2016/0240259 A1    Aug. 18, 2016

(51) Int. Cl.
  *G11C 16/04*    (2006.01)
  *G11C 16/14*    (2006.01)
  *G11C 16/26*    (2006.01)

(52) U.S. Cl.
  CPC .............. *G11C 16/14* (2013.01); *G11C 16/26* (2013.01)

(58) Field of Classification Search
  CPC ............... G11C 13/004; G11C 16/24; G11C 2029/0411; G11C 2213/71; G11C 2213/72; G11C 7/18; G11C 11/413; G11C 16/30; G11C 5/147; G11C 16/0483; G11C 16/28
  USPC ............... 365/185.18, 189.05, 148, 185.11, 365/185.23, 226, 163, 185.03, 185.12, 365/185.17, 185.2, 185.33, 189.011, 365/189.09, 229, 230.03
  See application file for complete search history.

(56) References Cited

U.S. PATENT DOCUMENTS

| | | | |
|---|---|---|---|
| 2003/0235086 A1* | 12/2003 | Lin ...................... | G11C 16/30 365/189.09 |
| 2011/0169070 A1* | 7/2011 | Osabe ................... | B82Y 10/00 257/324 |

* cited by examiner

*Primary Examiner* — Thong Q Le
(74) *Attorney, Agent, or Firm* — Jones Day

(57) ABSTRACT

Systems, devices and methods are provided for memory operations. An example system includes: a latch circuit shared by a plurality of memory blocks of a memory device and configured to provide one or more regulation signals for a memory operation; a source line circuit shared by the plurality of memory blocks and configured to provide a source line voltage to the plurality of memory blocks for the memory operation based at least in part on the one or more regulation signals; and a plurality of driver circuits configured to provide a plurality of drive signals to the plurality of memory blocks based at least in part on the one or more regulation signals.

19 Claims, 7 Drawing Sheets

SYSTEMS, DEVICES AND METHODS FOR MEMORY OPERATIONS

BACKGROUND

The technology described in this disclosure relates generally to electronic devices and more particularly to memory devices.

Semiconductor memory devices have been widely used for many applications. The continuing development of semiconductor memory devices results in increased memory capacity and reduced chip size. A memory device (e.g., a flash memory) may include a memory array having a large number of memory cells arranged in blocks (e.g., pages). A memory cell is often fabricated with one or more transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
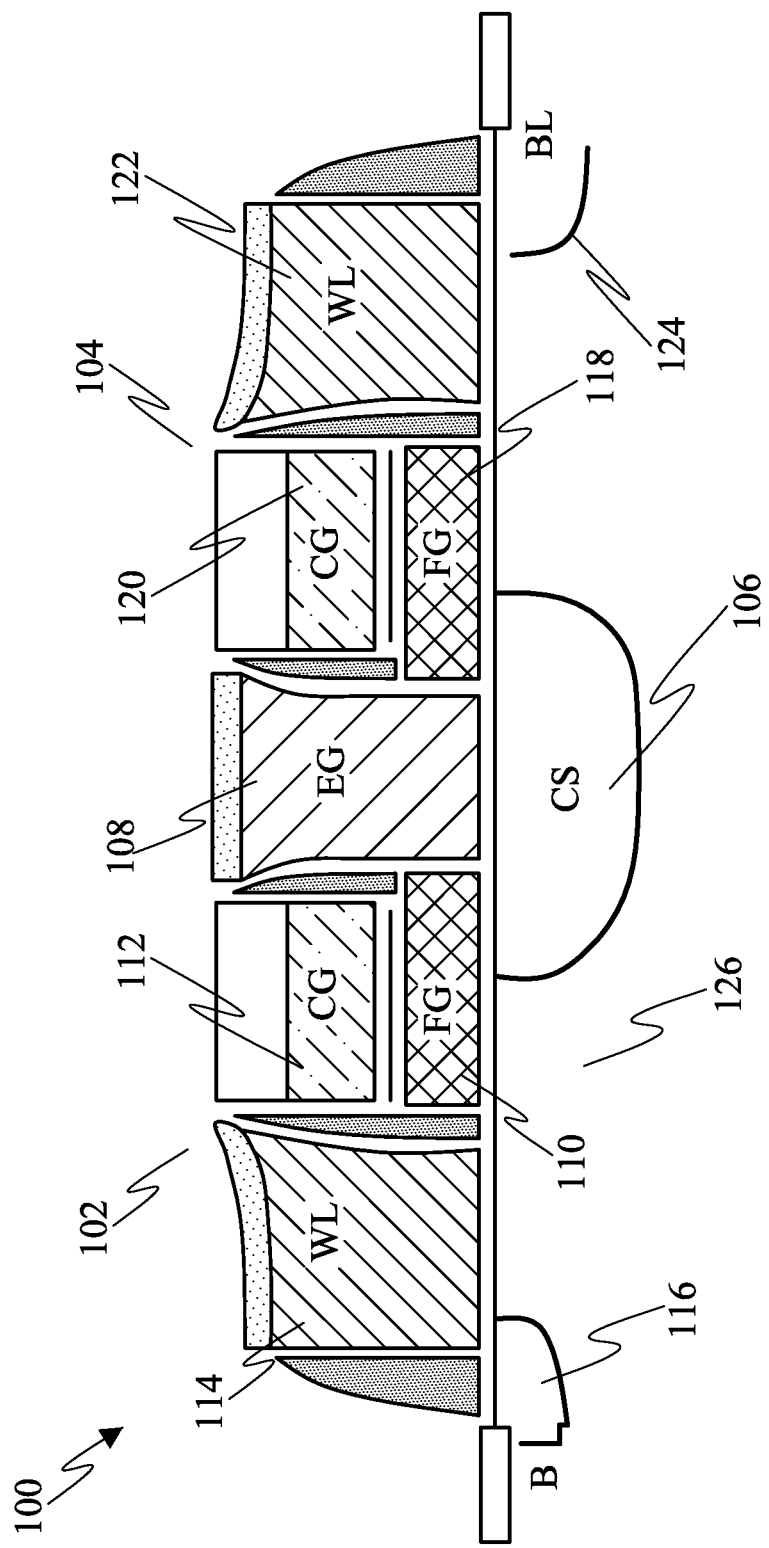
FIG. 1 depicts an example diagram of a memory unit, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "in," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Conventional memory architecture often requires one or more driver circuits for each memory block. For example, a high voltage driver and a source line driver are provided for each memory block in the memory architecture to perform memory operations, such as erase and program. These driver circuits contribute a certain percentage of the overall size of the memory device. Under certain circumstances, the area overhead of the driver circuits in the memory architecture may become significant. As an example, for smart card applications, a small block size is usually required for frequent data updates. Memory architecture and/or driver circuit architecture can be improved to reduce the area overhead of the driver circuits.

FIG. 1 depicts an example diagram of a memory unit, in accordance with some embodiments. As shown in FIG. 1, the memory unit 100 (e.g., as part of a non-volatile memory device) includes memory cells 102 and 104 which share a common source (CS) 106 and an erase gate (EG) 108. The memory cell 102 includes a floating gate (FG) 110, a control gate (CG) 112, a word line (WL) 114, and a bit line (BL) 116. For example, the BL 116 may be shared with another memory unit. In addition, the memory cell 104 includes a FG 118, a CG 120, a WL 122 and a BL 124. For example, the BL 124 may be shared with another memory unit.

The memory cells 102 and 104 are capable of several memory operations, including program, read, write and erase. The floating gates 110 and 118 are capable of holding electrical charges, and data in the memory cells 102 and 104 are determined by the presence or absence of charges on the floating gates 110 and 118 respectively. For example, the memory cell 102 may be charged by injecting electrons onto the FG 110, and the charges may be removed from the FG 110 by tunneling the electrons (e.g., through a thin oxide in contact with the FG 110) during an erase operation. The control gates 112 and 120 are disconnected from each other, and thus may be biased to different voltages.

For example, within the memory unit 100, the memory cell 102 is selected and the memory cell 104 is not selected for certain memory operations, e.g., read, program, and erase. Table 1 shows voltages applied to different components of the memory cell 102 and different components of the memory cell 104 for the memory operations. For example, "HV1" corresponds to 11 volts, "MV" corresponds to 4.3 volts, "HV2" corresponds to 13 volts, "VPWL" corresponds to 0.9 volt, "VRBL" corresponds to 0.6 volt, "VPBL" corresponds to 0.2 volt, and "VIB" corresponds to 1.3 volts.

TABLE 1

|  | EG 108 | CG 112 | WL 114 | CS 106 | BL 116 | CG 120 | WL 122 | BL 124 |
| --- | --- | --- | --- | --- | --- | --- | --- | --- |
| Read | VDD | VDD | VDD | 0 | VRBL | VDD | 0 | 0 |
| Program | MV | HV1 | VPWL | MV | VPBL | 0 | 0 | VIB |
| Erase | HV2 | 0 | 0 | 0 | 0 | 0 | 0 | 0 |

For example, as shown in Table 1, during a program operation, a voltage of 0.2 volt is applied to the bit line 116, and another voltage of 4.3 volts is applied to the common source 106. A voltage of 0.9 volt is applied to the word line 114 to turn on a channel in the substrate 126. A current flows between the common source 106 and the bit line 116. A voltage of 11 volts is applied to the control gate 112, and thus electrons are programmed onto the floating gate 110 under the influence of a high electrical field. Similarly, the read operation and the erase operation can be performed through the application of different voltages on the components of the memory cell 102.

Figure 2:
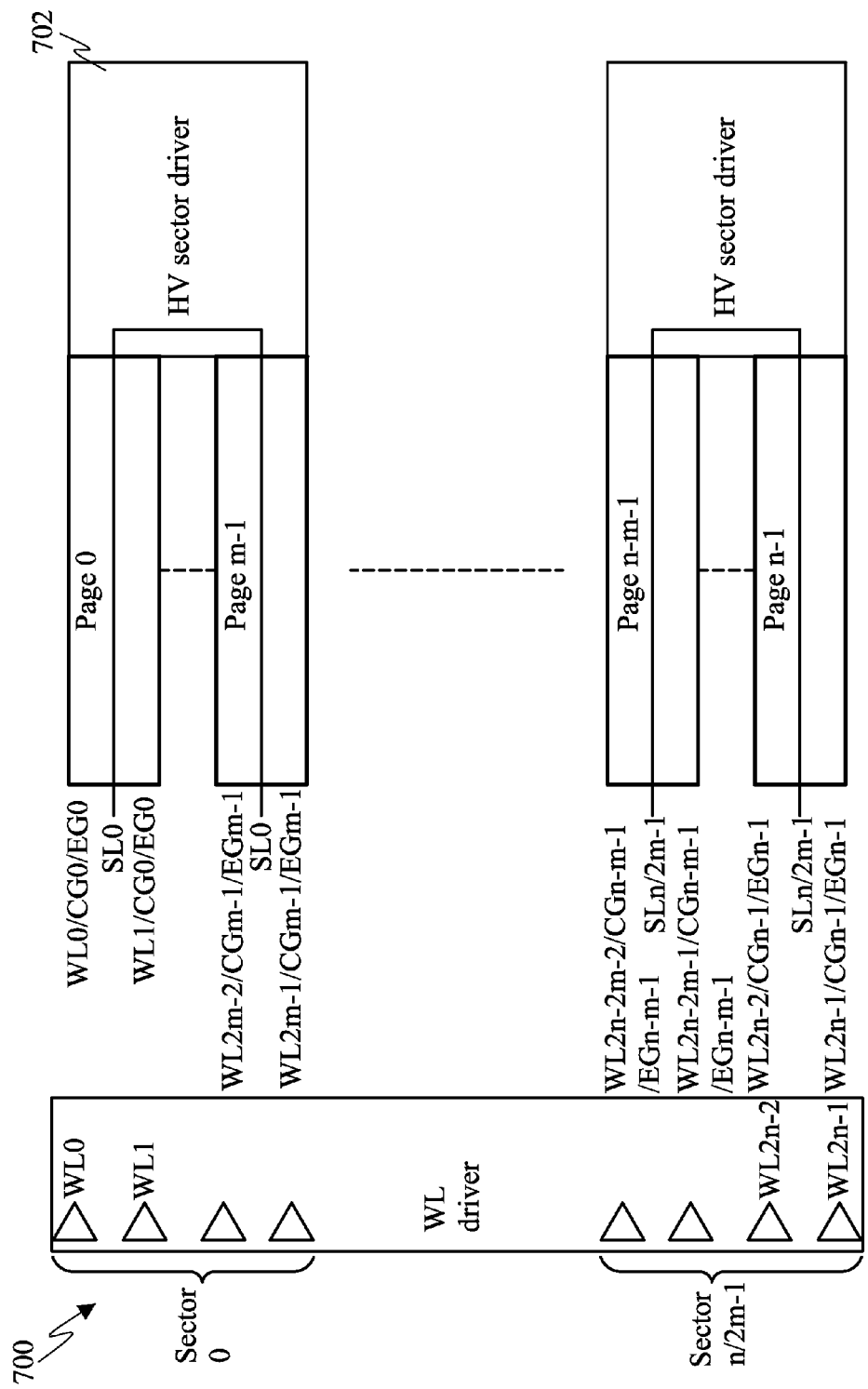
FIG. 2 depicts an example diagram of memory array architecture, in accordance with some embodiments.

FIG. 2 depicts an example diagram of memory array architecture, in accordance with some embodiments. As shown in FIG. 2, instead of each memory block having its own driver circuit, a sector driver circuit (e.g., the circuit 702) is shared by a plurality of memory blocks (e.g., page 0, ..., page m−1). In addition, a common source line (e.g., SL0) is shared by the plurality of memory blocks. For example, each memory block includes two word lines (e.g., WL0, WL1) which intersect with multiple bit lines (not shown) for selecting one or more memory cells within the block for the memory operations. As an example, each memory block includes one or more memory units (e.g., the memory unit 100).

Figure 3:
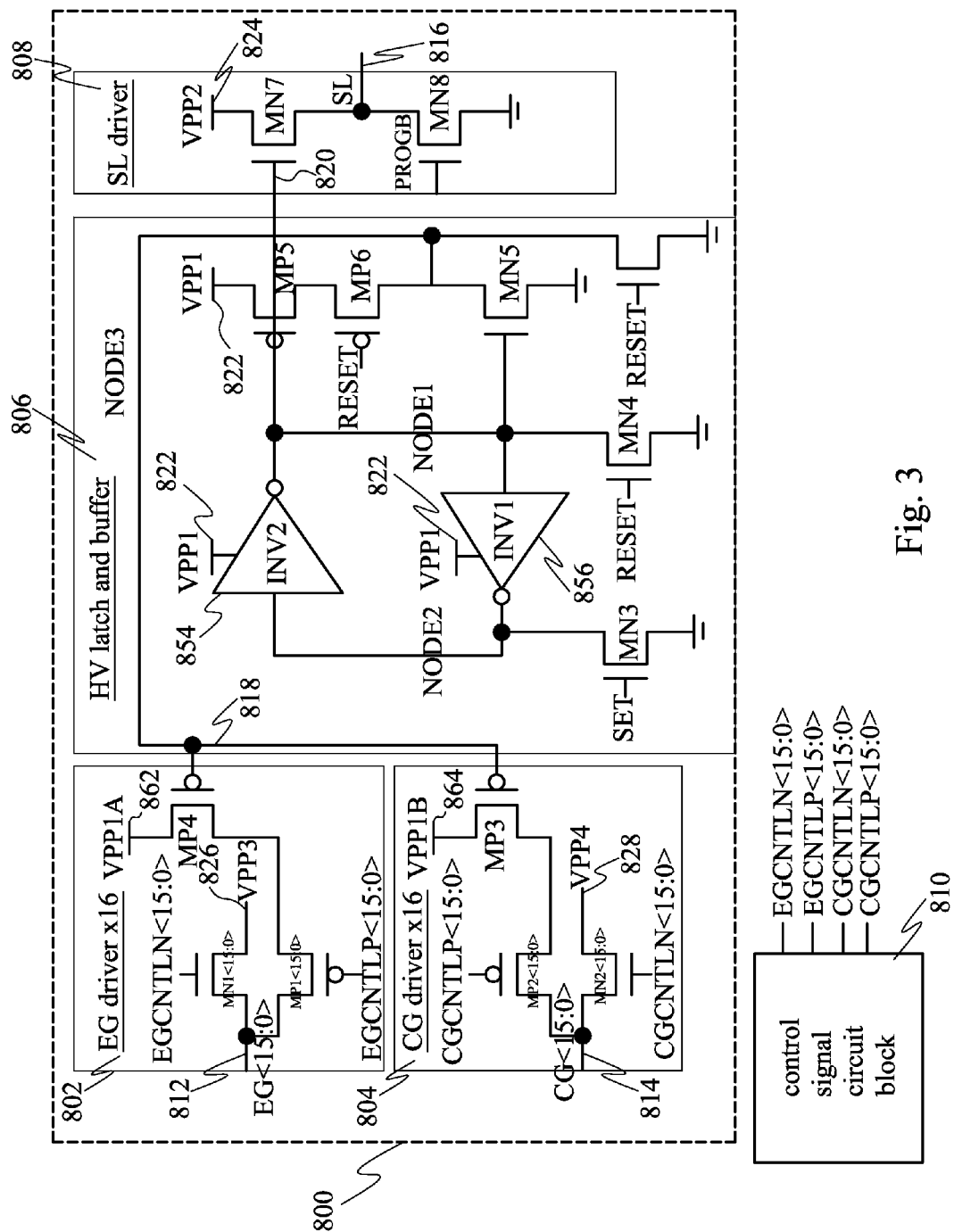
FIG. 3 depicts an example diagram of a sector driver circuit shared by a plurality of memory blocks, in accordance with some embodiments.

FIG. 3 depicts an example diagram of a sector driver circuit shared by a plurality of memory blocks, in accordance with some embodiments. As shown in FIG. 3, the sector driver circuit 800 (e.g., the driver circuit 702 as shown in FIG. 2) includes a latch circuit 806 and a source-line (SL) driver 808 that are shared by a plurality of memory blocks. In addition, the sector driver circuit 800 includes a plurality of EG drivers (e.g., EG<0>, EG<1>, ..., EG<15>) and a plurality of CG drivers (e.g., CG<0>, CG<1>, ..., CG<15>) for the plurality of memory blocks, where each memory block corresponds to an EG driver and a CG driver. The sector driver circuit 800 receives one or more control signals from a control signal circuit 810, and provides one or more drive signals to the plurality of memory blocks for memory operations.

For example, the sector driver circuit 800 is shared by 16 memory blocks (e.g., page 0, ..., page 15). In some circumstances, a memory block (e.g., page 0) is selected for memory operations, and other memory blocks (e.g., page 1, ..., page 15) are not selected. An EG driver 802 (e.g., EG<0>) provides a drive signal 812 to the terminal EG of a memory cell in the selected memory block (e.g., page 0), the CG driver 804 provides a drive signal 814 to the terminal CG (e.g., CG<0>) of the memory cell, and the SL driver 808 provides a source line voltage 816 to the common source line SL shared by all the memory blocks. The latch circuit 806 that includes two inverters 854 and 856 provides a voltage 818 to both the EG driver 802 and the CG driver 804 and provides a voltage 820 to the SL driver 808. In some embodiments, a power supply voltage generator (not shown) is configured to provide power supply voltages 822, 824, 826, 828, 862 and 864 to the sector driver circuit 800.

Table 1 shows drive signals provided by the driver circuit 800 to terminals of one or more memory cells within the selected memory block (e.g., page 0), Table 2 shows control signals provided by the control signal circuit 810 for certain memory operations, and Table 3 shows power supply voltages provided to the driver circuit 800 for the memory operations. For example, "HV1" corresponds to 11 volts, "MV" corresponds to 4.3 volts, and "HV2" corresponds to 13 volts.

TABLE 1

| | Terminals of memory cell | | | | |
|---|---|---|---|---|---|
| | EG<0> | EG<15:1> | CG<0> | CG<15:1> | SL |
| Read | VDD | VDD | VDD | VDD | 0 |
| Program | MV | 0 | HV1 | 0 | MV |
| Erase | HV2 | 0 | 0 | 0 | 0 |

TABLE 2

| | Control signals | | | | | | | | | | |
|---|---|---|---|---|---|---|---|---|---|---|---|
| | SET | RESET | PROGB | EGCNTL P<0> | EGCNTL P<15:1> | EGCNTL N<0> | EGCNTL N<15:1> | CGCNTL P<0> | CGCNTL P<15:1> | CGCNTL N<0> | CGCNTL N<15:1> |
| Read | 0 | VDD | VDD | 0 | 0 | 0 | 0 | 0 | 0 | 0 | 0 |
| Program | VDD | 0 | 0 | 0 | HV1 | 0 | HV1 | 0 | HV1 | 0 | HV1 |
| Erase | VDD | 0 | VDD | 0 | HV2 | 0 | HV2 | HV2 | HV2 | HV2 | HV2 |

TABLE 3

| | Power supply voltages | | | |
|---|---|---|---|---|
| | VPP1 | VPP2 | VPP3 | VPP4 |
| Read | VDD | VDD | VDD | VDD |
| Program | HV1 | MV | MV | VDD |
| Erase | HV2 | VDD | VDD | 0 |

Figure 4:
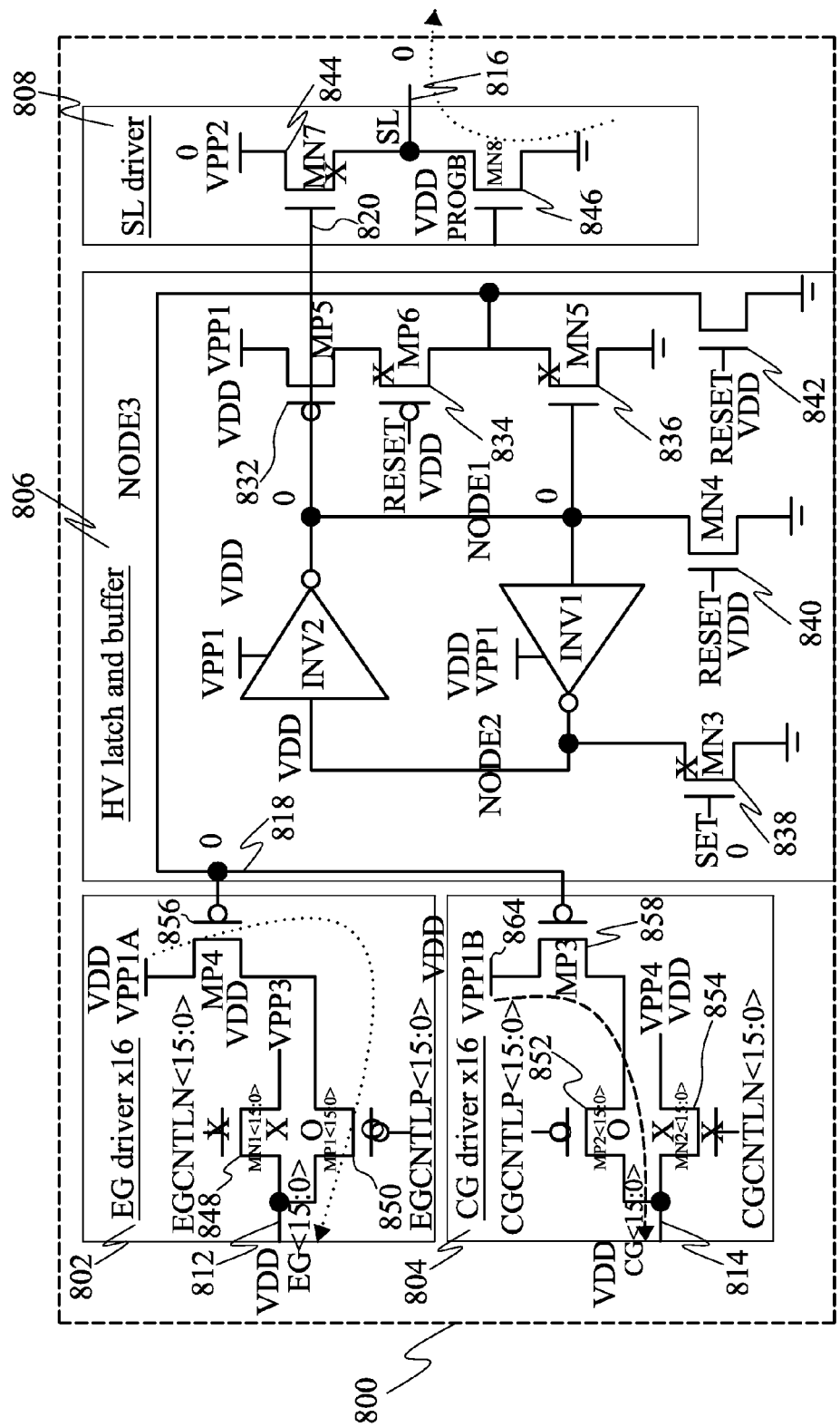
FIG. 4-FIG. 6 depict example diagrams showing different memory operations using the sector driver circuit shown in FIG. 8, in accordance with some embodiments.

As shown in Table 1-Table 3, for a read operation, certain power supply voltages and control signals are provided to the driver circuit 800. Specifically, the selected memory block and other memory blocks receive the same power supply voltages and the same control signals. As shown in FIG. 4, in response to the applied power supply voltages and the control signals, the transistors 834, 836, 838 and 844 are turned off, and the transistors 832, 840, 842 and 846 are turned on. For the selected memory block (e.g., page 0), the transistor 848 in the EG driver 802 and the transistor 854 in the CG driver 804 are turned off, and the transistor 850 in the EG driver 802 and the transistor 852 in the CG driver 804 are turned on. The voltages 818 and 820 become equal to a low voltage (e.g., 0 volt). The drive signals 812 and 814 are set to the power supply voltage "VDD" and the source line voltage 816 is set to a low voltage (e.g., 0 volt). Also, as shown in Table 1-Table 3, the other memory blocks (e.g., page 1-page 15) each receive the drive signals equal to the power supply voltage "VDD" from the respective EG driver and the respective CG driver, and each receive the source line voltage 816 that is equal to a low voltage (e.g., 0 volt) from the SL driver 808.

Figure 5:
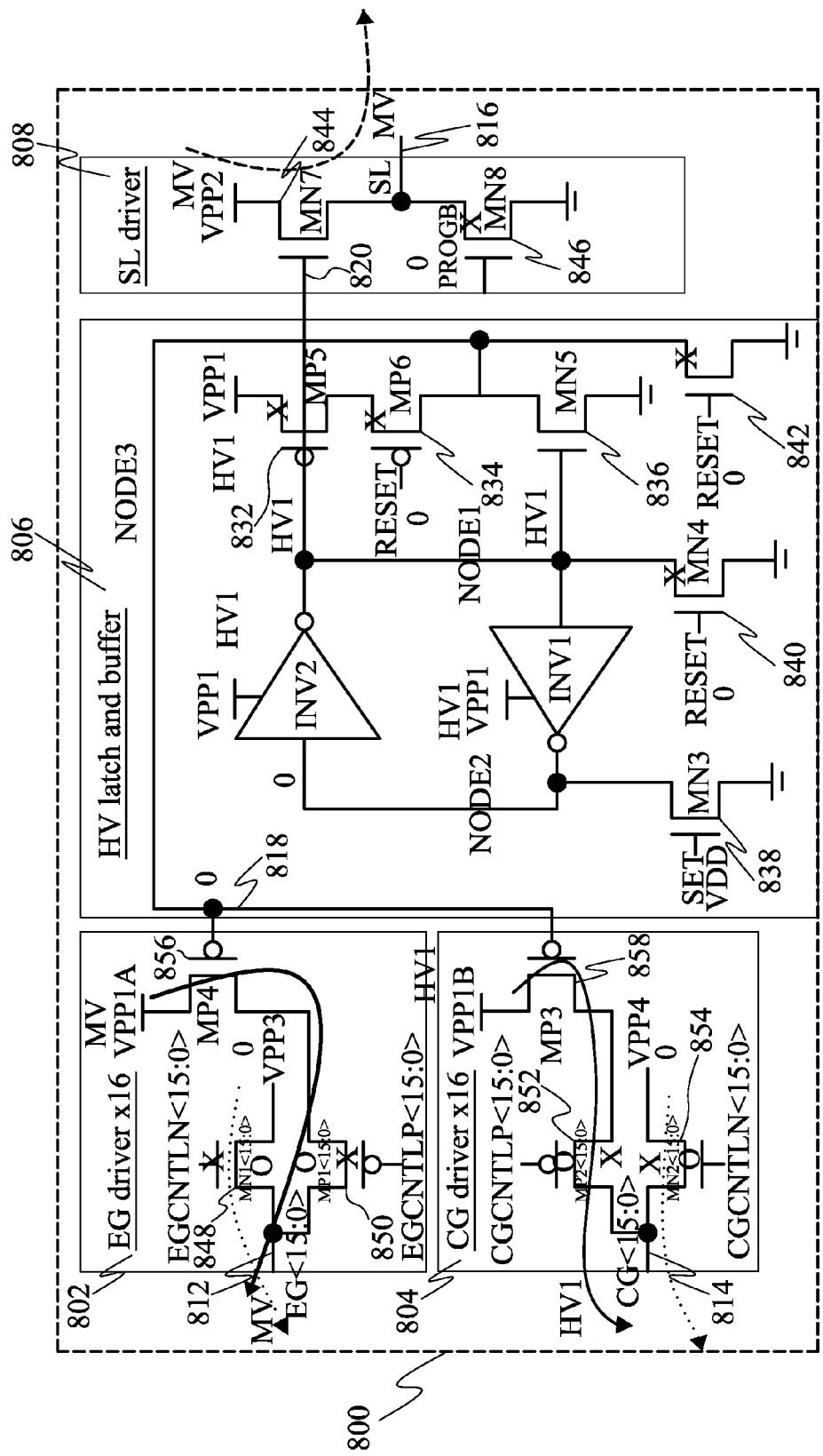

As shown in Table 1-Table 3, for a program operation, some power supply voltages and control signals are provided to the driver circuit 800. Specifically, the selected memory block and other memory blocks receive the same power supply voltages and different control signals. As shown in FIG. 5, in response to the applied power supply voltages and the control signals, the transistors 832, 834, 840, 842 and 846 are turned off, and the transistors 836, 838, and 844 are turned on. For the selected memory block (e.g., page 0), the transistor 848 in the EG driver 802 and the transistor 854 in the CG driver 804 are turned off, and the transistor 850 in the EG driver 802 and the transistor 852 in the CG driver 804 are turned on. The voltage 818 becomes equal to a low voltage (e.g., 0 volt), and the voltage 820 becomes equal to the voltage "HV1." The drive signal 812 and the source line voltage 816 are set to the voltage "MV" and the drive signal 814 is set to the voltage "HV1." Also, as shown in Table 1-Table 3, the other memory blocks (e.g., page 1-page 15) each receive the drive signals equal to a low voltage (e.g., 0 volt) from the respective EG driver and the respective CG driver, and each receive the source line voltage 816 that is equal to the voltage "MV" from the SL driver 808.

Figure 6:
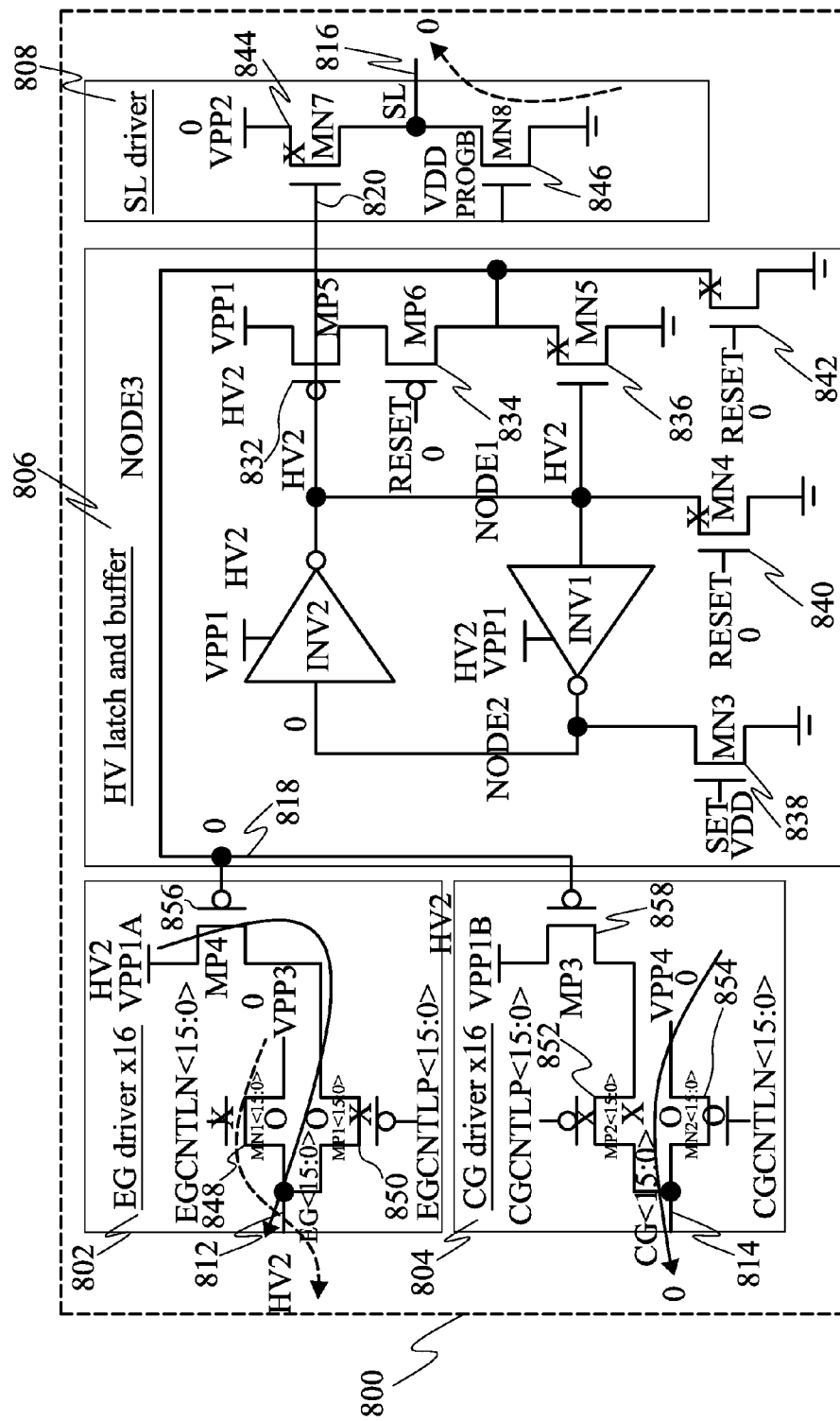

As shown in Table 1-Table 3, for an erase operation, certain power supply voltages and control signals are provided to the driver circuit 800. Specifically, the selected memory block and other memory blocks receive the same power supply voltages, certain same control signals and other different control signals. As shown in FIG. 6, in response to the applied power supply voltages and the control signals, the transistors 836, 840, 842 and 844 are turned off, and the transistors 832, 834, 838, and 846 are turned on. For the selected memory block (e.g., page 0), the transistor 848 in the EG driver 802 and the transistor 852 in the CG driver 804 are turned off, and the transistor 850 in the EG driver 802 and the transistor 854 in the CG driver 804 are turned on. The voltage 818 becomes equal to a low voltage (e.g., 0 volt), and the voltage 820 becomes equal to the voltage "HV2." The drive signal 814 and the source line voltage 816 are set to a low voltage (e.g., 0 volt) and the drive signal 812 is set to the voltage "HV2." Also, as shown in Table 1-Table 3, the other memory blocks (e.g., page 1-page 15) each receive the drive signals equal to a low voltage (e.g., 0 volt) from the respective EG driver and the respective CG driver, and each receive the source line voltage 816 that is equal to the low voltage (e.g., 0 volt) from the SL driver 808.

Figure 7:
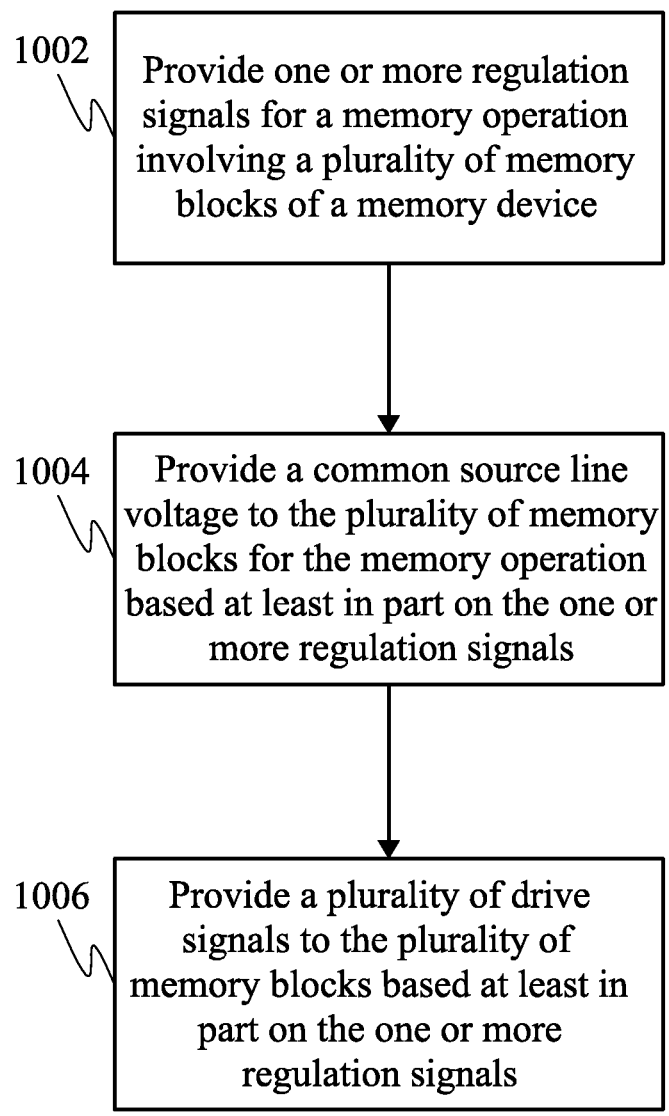
FIG. 7 depicts an example flow chart for performing memory operations, in accordance with some embodiments.

FIG. 7 depicts an example flow chart for performing memory operations, in accordance with some embodiments. At 1002, one or more regulation signals for a memory operation involving a plurality of memory blocks of a memory device. For example, a latch circuit shared by a plurality of memory blocks of a memory device is configured to provide the one or more regulation signals. At 1004, a common source line voltage is provided to the plurality of memory blocks for the memory operation based at least in part on the one or more regulation signals. For example, a source line circuit shared by the plurality of memory blocks is configured to provide the common source line voltage. At 1006, a plurality of drive signals are provided to the plurality of memory blocks based at least in part on the one or more regulation signals. As an example, a plurality of driver circuits are configured to provide the plurality of drive signals.

According to one embodiment, a system includes: a latch circuit shared by a plurality of memory blocks of a memory device and configured to provide one or more regulation signals for a memory operation; a source line circuit shared by the plurality of memory blocks and configured to provide a source line voltage to the plurality of memory blocks for the memory operation based at least in part on the one or more regulation signals; and a plurality of driver circuits configured to provide a plurality of drive signals to the plurality of memory blocks based at least in part on the one or more regulation signals.

According to another embodiment, a memory device includes: a plurality of memory blocks; a common source line shared by the plurality of memory blocks; and a sector driver circuit shared by the plurality of memory blocks, the sector driver circuit being configured to provide a source line voltage to the common source line and provide a plurality of drive signals to the plurality of memory blocks for a memory operation.

According to yet another embodiment, a method is provided for performing memory operations. One or more regulation signals for a memory operation involving a plurality of memory blocks of a memory device. A common source line voltage is provided to the plurality of memory blocks for the memory operation based at least in part on the one or more regulation signals. A plurality of drive signals are provided to the plurality of memory blocks based at least in part on the one or more regulation signals.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A system for memory operations, the system comprising:
   a memory device including a plurality of memory blocks;
   a latch circuit shared by the plurality of memory blocks and configured to provide first and second regulation signals for a memory operation;
   a source line circuit shared by the plurality of memory blocks and configured to provide a source line voltage to the plurality of memory blocks for the memory operation based at least in part on the second regulation signal; and
   a plurality of driver circuits configured to provide a plurality of drive signals to the plurality of memory blocks based at least in part on the first regulation signal.

2. The system of claim 1, further comprising:
   a control signal generator configured to provide one or more control signals to the latch circuit;
   wherein the latch circuit is configured to provide the first and second regulation signals based at least in part on the one or more control signals.

3. The system of claim 1, further comprising:
   a control signal generator configured to provide a plurality of control signals to the plurality of driver circuits based at least in part on the memory operation.

4. The system of claim 3, wherein:
   the control signal generator is further configured to, in response to the memory operation corresponding to a read operation, provide same control signals to the plurality of driver circuits.

5. The system of claim 3, wherein:
   the control signal generator is further configured to, in response to the memory operation corresponding to a program operation or an erase operation, provide different control signals to the plurality of driver circuits.

6. The system of claim 1, wherein the plurality of driver circuits correspond to the plurality of memory blocks, respectively.

7. The system of claim 1, wherein:
a memory block includes one or more memory cells; and
a memory cell includes a floating gate for storing electrical charges, a control gate for controlling the floating gate, and an erase gate for removing the electrical charges.

8. The system of claim 7, wherein a driver circuit for the memory block includes an erase gate driver configured to provide a gate control signal to the erase gate.

9. The system of claim 7, wherein a driver circuit for the memory block includes a control gate driver configured to provide a gate control signal to the control gate.

10. The system of claim 1, wherein the latch circuit includes:
a first inverter including a first input terminal and a first output terminal; and
a second inverter including a second input terminal and a second output terminal, the second input terminal being coupled to the first output terminal and the second output terminal being coupled to the first input terminal.

11. The system of claim 10, wherein the latch circuit is further configured to provide the second regulation signal at the second output terminal to the source line circuit.

12. The system of claim 10, wherein the latch circuit further includes a transistor network coupled to the second output terminal and the first input terminal and configured to provide the first regulation signal to the plurality of driver circuits.

13. The system of claim 12, wherein the transistor network includes one or more p-type transistors and one or more n-type transistors.

14. The system of claim 1, wherein:
the source line circuit includes: a plurality of first n-type transistors; and
a driver circuit includes: one or more p-type transistors and one or more second n-type transistors.

15. A memory device comprising:
a plurality of memory blocks;
a common source line shared by the plurality of memory blocks;
a sector driver circuit shared by the plurality of memory blocks, the sector driver circuit being configured to provide a source line voltage to the common source line and provide a plurality of drive signals to the plurality of memory blocks for a memory operation; and
a control signal generator configured to provide one or more control signals to the sector driver circuit;
wherein the sector driver circuit is configured to provide the source line voltage and the plurality of drive signals based at least in part on the one or more control signals; and
wherein the sector driver circuit includes:
a latch circuit shared by the plurality of memory blocks and configured to provide one or more regulation signals based at least in part on the one or more control signals; and
a source line circuit shared by the plurality of memory blocks and configured to provide the source line voltage based at least in part on the one or more regulation signals.

16. The device of claim 15, wherein the sector driver circuit further includes:
a plurality of block driver circuits configured to provide the plurality of drive signals to the plurality of memory blocks based at least in part on the one or more regulation signals.

17. A method for use with a memory device that includes a plurality of memory blocks, the method comprising:
providing first and second regulation signals for a memory operation involving the the plurality of memory blocks of the memory device;
providing a common source line voltage to the plurality of memory blocks for the memory operation based at least in part on the first regulation signal; and
providing a plurality of drive signals to the plurality of memory blocks based at least in part on the second regulation signal.

18. The method of claim 17, wherein the first and second regulation signals are provided based at least in part on one or more control signals.

19. The method of claim 18, wherein the one or more control signals are provided based at least in part on the memory operation.

* * * * *